(12) United States Patent
Weis et al.

(10) Patent No.: US 9,698,130 B2
(45) Date of Patent: Jul. 4, 2017

(54) CONNECTION SYSTEM FOR ELECTRONIC COMPONENTS

(71) Applicant: AT&S Austria Technologie & Systemtechnik Aktiengesellschaft, Leoben (AT)

(72) Inventors: Gerald Weis, St. Marein im Murztal (AT); Christian Vockenberger, Leoben (AT); Roland Sekavcnik, Leoben (AT)

(73) Assignee: AT&S AUSTRIA TECHNOLOGIE & SYSTEMTECHNIK AKTIENGESELLSCHAFT, Leoben (AT)

( * ) Notice: Subject to any disclaimer, the term of this patent is extended or adjusted under 35 U.S.C. 154(b) by 0 days.

(21) Appl. No.: 15/272,568

(22) Filed: Sep. 22, 2016

(65) Prior Publication Data

US 2017/0092630 A1    Mar. 30, 2017

(30) Foreign Application Priority Data

Sep. 24, 2015    (EP) .................................... 15186707

(51) Int. Cl.
*H01L 23/34* (2006.01)
*H01L 25/16* (2006.01)
(Continued)

(52) U.S. Cl.
CPC .......... *H01L 25/16* (2013.01); *H01L 23/3677* (2013.01); *H01L 23/467* (2013.01);
(Continued)

(58) Field of Classification Search
CPC ..... H01L 23/5383; H01L 25/16; H05K 1/181; H05K 1/185
(Continued)

(56) References Cited

U.S. PATENT DOCUMENTS

2008/0318055 A1    12/2008    Fillion et al.
2010/0236821 A1    9/2010    Park et al.
(Continued)

FOREIGN PATENT DOCUMENTS

AT    WO 2010048653 A2 *   5/2010   ......... H01L 21/6835
AT    EP 3091822 A1 *  11/2016   ........... H01L 33/095

OTHER PUBLICATIONS

European Search Report of Application No. 15166915.7 dated Sep. 29, 2015.

*Primary Examiner* — David S Blum
(74) *Attorney, Agent, or Firm* — Eversheds Sutherland (US) LLP

(57) ABSTRACT

In a connection system for electronic components (1) comprising a plurality of insulating layers (2) and conductive layers (3) and further comprising at least one embedded electronic component (4) embedded within at least one of the plurality of insulating layers (2) and conductive layers (3) the at least one embedded electronic component (4) is at least one first transistor having a bulk terminal thereof in thermal contact with a thermal duct (6) comprised of a plurality of vias (7) reaching through at least one of an insulating layer (2) and a conductive layer (3) of the connection system for electronic components (1) and emerging on a first outer surface (8) of the connection system for electronic components (1) under a first surface-mounted component (10).

12 Claims, 1 Drawing Sheet

(51) Int. Cl.
    *H01L 23/467*     (2006.01)
    *H01L 23/538*     (2006.01)
    *H01L 23/00*     (2006.01)
    *H01L 25/07*     (2006.01)
    *H05K 1/02*     (2006.01)
    *H05K 1/11*     (2006.01)
    *H05K 1/18*     (2006.01)
    *H05K 7/20*     (2006.01)
    *H01L 23/367*     (2006.01)
    *H01L 25/10*     (2006.01)

(52) U.S. Cl.
CPC ...... *H01L 23/5383* (2013.01); *H01L 23/5384* (2013.01); *H01L 23/5389* (2013.01); *H01L 24/17* (2013.01); *H01L 24/19* (2013.01); *H01L 24/20* (2013.01); *H01L 25/074* (2013.01); *H01L 25/105* (2013.01); *H05K 1/0206* (2013.01); *H05K 1/0298* (2013.01); *H05K 1/115* (2013.01); *H05K 1/181* (2013.01); *H05K 1/185* (2013.01); *H05K 7/20154* (2013.01); *H01L 2223/6677* (2013.01); *H01L 2224/04105* (2013.01); *H01L 2224/12105* (2013.01); *H01L 2224/16227* (2013.01); *H01L 2224/2518* (2013.01); *H01L 2225/1035* (2013.01); *H01L 2225/1047* (2013.01); *H01L 2225/1094* (2013.01); *H01L 2924/1033* (2013.01); *H01L 2924/1306* (2013.01); *H01L 2924/13055* (2013.01); *H01L 2924/1426* (2013.01); *H01L 2924/1436* (2013.01); *H01L 2924/153* (2013.01); *H01L 2924/19041* (2013.01); *H01L 2924/19042* (2013.01); *H01L 2924/19043* (2013.01); *H01L 2924/19102* (2013.01); *H01L 2924/19105* (2013.01); *H05K 1/0209* (2013.01); *H05K 1/0212* (2013.01); *H05K 2201/10015* (2013.01); *H05K 2201/10166* (2013.01)

(58) Field of Classification Search
USPC .......................................................... 257/713
See application file for complete search history.

(56) References Cited

U.S. PATENT DOCUMENTS

| | | |
|---|---|---|
| 2011/0203107 A1 | 8/2011 | Schrittwieser et al. |
| 2014/0264417 A1 | 9/2014 | Kobayashi et al. |
| 2015/0221842 A1* | 8/2015 | Mima ................ H01L 33/62 |
| | | 257/99 |
| 2015/0255380 A1* | 9/2015 | Chen ............. H01L 23/49568 |
| | | 361/707 |
| 2016/0133558 A1* | 5/2016 | Stahr .................. H01L 23/36 |
| | | 257/692 |
| 2017/0062992 A1* | 3/2017 | Fischeneder ........ H01R 12/721 |

* cited by examiner

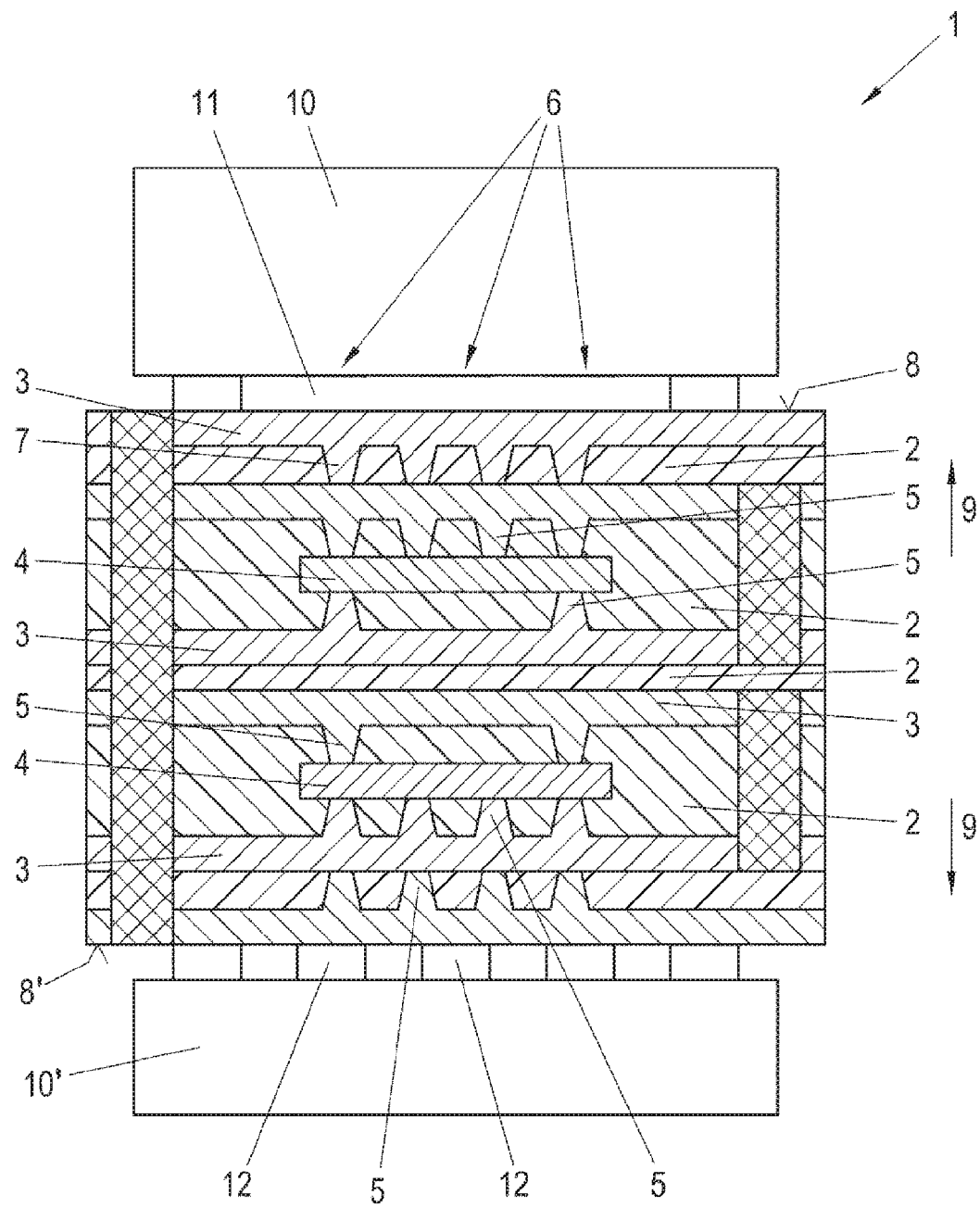

CONNECTION SYSTEM FOR ELECTRONIC COMPONENTS

The invention relates to a connection system for electronic components comprising a plurality of insulating layers and conductive layers and further comprising at least one embedded electronic component embedded within at least one of the plurality of insulating layers and conductive layers.

DESCRIPTION OF THE RELATED ART

The invention relates to connection panels for electronic components in general, wherein electronic components such as transistors, integrated circuits (ICs, microchips) and the like are arranged on or embedded within a panel carrying and electrically connecting those electronic components. Such connection panels can be printed circuit boards (PCBs) or IC-substrates used for connecting a single integrated circuit or a plurality of integrated circuits to a printed circuit board. In fact, IC-substrates and printed circuit boards are highly similar in their basic functionalities and differ merely in size as will be explained and defined at a later stage of this description. For the purposes of this description the terms "printed circuit board", "IC-substrate" and "connection panel for electronic components" can be used interchangeably. For the sake of simplicity the following description is mostly directed to printed circuit boards, it is, however, clear the skilled person that the details given in this description may be understood also with reference to IC-substrates.

A component within the sense of the present invention can be any active electronic component or passive component. In particular a component can be a an electronic chip, in particular semiconductor chip, a capacitor, a resistor, an inductance, a data storage such as a DRAM, a filter (high pass filter, low pass filter, band pass filter), a microprocessor, a performance management component, an optoelectronic component, a voltage converter (AC/DC converter, DC/DC converter), an electromechanical transducer (e.g. PZT (lead-zirconate-titanate)-sensor and/or -actor), a transmitter and/or receiver of electromagnetic waves (e.g. an RFID-chip or a transponder), a cryptographic component, a switch (e.g. a transistor-based switch), a microelectromechanical system (MEMS), a battery a camera, an antenna and the like.

Printed circuit boards and IC-substrates, also referred to as printed wiring boards or connection panels for electronic components, are panels carrying and electrically connecting electronic components such as transistors and the like and, hence, form vital parts of electronic devices. Printed circuit boards have a more or less complex structure depending on the specific application. In general, a printed circuit board comprises a plurality of alternately applied conductive layers and insulating layers and the conductive layers are bonded together usually by hardening panels or plies of glass fibers impregnated with organic resin, said panels forming the insulating layers. Such panels for use in the production of printed circuit boards are widely known in the industry as "prepregs" (preimpregnated fibers), which are delivered and processed in an uncured, hence viscous state of the organic resin. The actual insulating layer results when the organic resin has cured. The insulating layers thus carry the conductive layers, for example formed of copper foil, the conductive layers being appropriately processed to form wirings to electrically connect electronic components. Insulating layers can also be made from a material chosen from the group comprised of reinforced or non reinforced resins such as epoxy resin and prepreg-material (e.g. FR-4, FR-5), teflon®, polyamide, polyimide, esters of cyanate, bismaleimide-triazine resin, glasses, glass-like carrier-materials (e.g. multilayer-glass), reinforcing carrier materials, ceramics and metal oxides and high-frequency material. High-frequency materials are materials such as polytetrafluoroethylene, liquid crystal polymer or cyanate ester resins. While insulating layers are mostly continuous to provide electric insulation between the conductive layers of the printed circuit board, the conductive layers are usually strongly patterned and open work. Modern printed circuit boards allow for a high degree of integration of electronic components and their appropriate wiring. In the technical field of printed wiring boards, IC-substrates are known to offer similar functionality in terms of alternately applied conductive and insulating layers, however, IC-substrates are much smaller and often serve to connect a microchip to a printed circuit board. To this end, the insulating layers of IC-substrates are often produced of glass or ceramic materials which allows for smaller, high-precision structures.

There is, however, a constant need for further miniaturization in the electronic industry in order to provide consumers and professionals with ever smaller yet more capable electronic devices and installations which require more electronic components to be packaged and wired in a smaller space.

In this context it is nowadays often preferred to have electronic components embedded within the connection system for electronic components. With electronic components becoming ever smaller in size it becomes feasible to provide them as embedded components, which means that these components are not arranged on the surface of the connection system for electronic components, but rather within the thickness thereof. Embedding can be carried out by providing a cavity, for example, in an insulating layer of the connection system for electronic components. However, cavities for embedding electronic components can also reach through a plurality of insulating layers and conductive layers depending on the size of the electronic component to be embedded and the dimensions of the layers of the connection system for electronic components. Where there is a number of advantages related to embedded components in connection panels for electronic components, heat management of the embedded components is obviously a critical issue, especially when using high performance and/or high power components which produce considerable amounts of heat depending on the calculating load or on the currents that these components have to handle. Insulating layers in which the embedded components are embedded offer very poor heat transfer properties so that special measures must be taken when considerable amounts of heat have to be dealt with at the location of the embedded components. To this end it has already been proposed to arrange vias reaching from an embedded component to the surface of the connection system for electronic components.

It is an object of the present invention to improve the heat management in a connection system for electronic components of the initially mentioned kind, not only in terms of increased heat transport from the location of the embedded component to the surface of the connection system for electronic components, but also in terms of getting rid of heat on the surface as quickly as possible while using the space available on a connection system for electronic components as efficiently as possible.

DESCRIPTION OF INVENTION

To achieve this object in accordance with the present invention, a connection system for electronic components of the initially mentioned kind is characterized in that the at least one embedded electronic component is at least one first transistor having a bulk terminal thereof in thermal contact with a thermal duct comprised of a plurality of vias reaching through at least one of an insulating layer and a conductive layer of the connection system for electronic components and emerging on a first outer surface of the connection system for electronic components under a first surface-mounted component. The invention is thus characterized by a thermal duct formed by a plurality of vias, which vias are adapted to guide heat from the embedded component not only to the surface thereof, but to a surface-mounted electronic component so that the heat guided away from the embedded component by the thermal duct is not only distributed on the surface of the connection system for electronic components, but is conveyed into a surface mounted component which can absorb the heat energy from the embedded component and provide an increased volume and mass for dissipating this energy. Vias are known as holes in a connection system for electronic components such as a printed circuit board or IC-substrate and are in the present context usually filled with a metallic matrix. Such vias can reach through a single insulating layer or through multiple insulating layers and conductive layers of the connection system for electronic components. In the present invention the thermal duct takes the form of a plurality of vias emerging on the surface of the inventive connection system for electronic components from the depth of the connection system for electronic components where the embedded component is embedded. The heat from the embedded component will thus be transported through the via in a vertical sense, thus in a direction generally perpendicular to the plane of the connection system for electronic components, and will thus enter into a surface-mounted component arranged right above the emerging vias. A thermal duct in the sense of the present invention is an arrangement deliberately provided in the connection system for electronic components which is different from the electrical connections of the connection system for electronic components and which offers increased thermal conductivity as compared to the general rest of the connection system for electronic components. The term "thermal duct" thus defines structural elements, mostly of metal, which allow for vertical transfer of heat from the embedded component to the surface of the connection system for electronic components without having an electrical purpose. While in principle also the vertical electrical connection of an embedded component with a surface-mounted component will guide heat from the embedded component to a surface-mounted component when the surface-mounted component is arranged above the embedded component in a reasonable distance thereof, the term "thermal duct" in the sense of the present invention is intended to denote structures which are arranged in the connection system for electronic components for their heat guiding function only, so that the structures making up the thermal duct within the sense of the present invention will be arranged independently from vertical electrical connections between an embedded component and a surface-mounted component and will not serve any electrical purpose at all.

As already stated the inventive thermal duct does not serve any electrical purpose whatsoever and is only arranged to guide heat from the inner of the inventive connection system for electronic components to its surface and into a surface-mounted device. This, however, does not necessarily mean that the thermal duct according to the present invention cannot be in contact with electrically relevant structures of the inventive connection system for electronic components. In this context, it is conceivable that the thermal contact between the bulk terminal and the plurality of vias forming the thermal duct is mediated by a plurality of vias electrically connecting the bulk terminal to a conductive layer of the connection system for electronic components as it is in conformity with a variant of the present invention. In this case, the thermal guide picks up the heat from electrically used vias and guides it to the surface where the vias of the thermal duct are not further electrically contacted.

In order to profit from the layered structure of a connection system for electronic components described in this specification, the invention is preferably devised such that the connection system for electronic components further comprises at least one second transistor arranged opposite the first transistor relative to a central insulating layer of the connection system for electronic components and having a bulk terminal thereof connected by a plurality of vias to at least one second surface-mounted electronic component arranged on a second outer surface of the connection system for electronic components opposite the first outer surface. By such an arrangement, the inventive connection system for electronic components has its transistors conveying their heat to opposite surfaces of the inventive connection system for electronic components allowing for favorable dissipation of heat energy on surface-mounted devices of the connection system for electronic components of the present invention.

According to a preferred embodiment of the present invention, the second surface-mounted device is an integrated circuit adapted to drive the at least one first and second transistors. This preferred variant of the present invention allows one to form an effective arrangement of transistors and their integrated circuits required to drive or operate them which arrangement is particularly advantageous in terms of heat dissipation at a very small size of the arrangement. The surface-mounted devices on both surfaces of the inventive connection system for electronic components absorb and dissipate the heat energy of the transistors which therefore can handle high currents in the thickness of a small-dimensioned connection panel for electronic components or connection system for electronic components in general.

According to a preferred embodiment of the present invention, the connection system for electronic components comprises a first group of two first transistors connected in parallel and a second group of two second transistors connected in parallel, the first and the second group being connected in series. Such an arrangement is known as a half bridge which is a basic element of power electronics and often used to drive electric motors and other electric appliances that consume relatively high amounts of current as compared to the relatively low currents usually to be dealt with in computing electronics. By arranging two transistors connected in parallel in each group, the work load can be distributed to further avoid heat maxima in the inventive connection system for electronic components.

To efficiently further avoid heat maxima in an embedded component in a connection system for electronic components according to the present invention the vias are in thermal contact with a heat spreading plate arranged on or within the connection system for electronic components. Such heat spreading metallic plates are well known in the art of the production of connection panels for electronic components, like printed circuit boards or IC-substrates or the like, and are in principle metal plates to be arranged in the vicinity of the embedded component that produces the heat to be dealt with. By doing so the heat is guided away from the component and/or is quickly distributed so that heat maxima which might damage the embedded component can effectively be avoided.

In order to improve the heat transfer from the surface of the connection system for electronic components according to the present invention the vias can be in thermal contact with a conductive adhesive arranged between the outer surface of the connection system for electronic components and the at least one surface-mounted electronic component, as it is in accordance with a preferred embodiment of the present invention. The conductive adhesive will not only possibly help to fix and secure the surface-mounted component to the connection system for electronic components, but will also improve thermal contact between the surface of the connection system for electronic components and the surface-mounted component so that the heat from the embedded component will effectively be handed over to the surface-mounted component in order allow for the surface-mounted component to carry out the mentioned heat storing and heat distributing properties.

It goes without saying that guiding heat from embedded components to the surface and further into surface-mounted components of the inventive connection system for electronic components can be detrimental to the surface-mounted component when too much heat is to be dealt with, so that the person skilled in the art will have to decide whether the benefits of using the volume and the mass of the surface-mounted component as a heat storage and heat distributing volume or mass or the detrimental effects of the heat in the surface-mounted component will prevail when implementing the present invention. A particular advantage of a preferred embodiment of the present invention, however, is achieved when the at least one surface-mounted component is an anti-ferroelectric capacitor. Anti-ferroelectric capacitors are known to withstand temperatures of up to 200° C., while increasing the dielectric constant of the dielectric used in the capacitor so that the performance of the anti-ferroelectric capacitor is increased by the thermal duct from the embedded component through the heat duct, for example in the form of a plurality of vias, into the surface-mounted component in the form of an anti-ferroelectric capacitor. This configuration offers increased thermal management of large amounts of heat, for example produced by power transistors embedded in an inventive Connection system for electronic components, and at the same time increases the efficiency of a surface-mounted anti-ferroelectric capacitor. Anti-ferroelectric capacitors are produced, for example, under the trademark EPCOS CeraLink™.

Another preferred embodiment of the present invention is realized when the at least one first and second transistor is a transistor chosen from the group comprised of a field effect transistor, in particular a gallium-nitride power transistor, and an insulated gate bipolar transistor.

When particularly high amounts of heat are guided by the thermal duct into the surface-mounted component of the present invention it can be necessary to provide additional cooling to the surface-mounted component. Thus the present invention preferably is devised such that the at least one surface-mounted component cooperates with a cooling-fan. The cooling-fan, for example, may be arranged and mounted on the connection system for electronic components next to or over the surface-mounted component the heat is guided into.

The present invention can be put to use with particular advantage when the at least one first and second transistors are part of a partially embedded half-bridge circuit. A half-bridge circuit enables a voltage to be applied across a load in either direction. These circuits are often used in robotics and other applications to allow DC motors to run forwards and backwards.

The present invention can comprise a number of embedded components other than those described in particular those part of the half-bridge circuit. Consequently, the inventive connection system for electronic components can comprise at least one further embedded electronic component chosen from the group comprised of an electronic chip, in particular semiconductor chip, a capacitor, a resistor, an inductance, a data storage such as a DRAM, a filter, a microprocessor, a performance management component, an optoelectronic component, a voltage converter, an electromechanical transducer and/or -sensor and/or -actor), a transmitter and/or receiver of electromagnetic waves, a cryptographic component, a switch, a microelectromechanical system, a battery a camera and an antenna.

The present invention will now be exemplified in more detail by way of an exemplary embodiment shown in the drawing. In the drawing FIG. 1 shows a cross-sectional view through a connection system for electronic components according to the present invention.

In FIG. 1 the inventive connection system for electronic components is denoted by reference numeral 1. The connection system for electronic components consists of a plurality of insulating layers 2 and conductive layers 3 which make up the layered structure of the connection system for electronic components. The central insulating layer 2 and the two conductive layers 3 covering this central insulating layer 2 form the central core of the inventive connection system for electronic components 1. Embedded components 4 are embedded within insulating layers 2 of the connection system for electronic components 1, in this example the embedded components 4 take the form of gallium-nitride power transistors which are contacted by electric vias 5 to corresponding conductive layers 3 which are appropriately patterned to contact and drive the power transistors 4. Opposed to these electric vias 5 the thermal duct 6 in accordance with the present invention is formed by a plurality of thermal vias 7 which emerge on the first surface 8 of the connection system for electronic components 1 from the depth of the connection system for electronic components 1 in which the embedded component 4 is embedded. Thus heat generated by the embedded component 4 will be guided vertically in the sense of arrows 9 to the surface 8 of the connection system for electronic components 1 and further into surface-mounted components 10 which can, for example, be anti-ferroelectric capacitors which operate more efficiently at elevated temperatures. Optionally a conductive adhesive 11 can be interposed between the surface of the connection system for electronic components 1 and the surface-mounted component 10, however, the heat delivered by the thermal duct 6 can also migrate into the second surface-mounted component 10' by solder balls 12 arranged on the second surface-mounted component 10' and being in contact with the surface 8 of the connection system for electronic components 1.

The invention claimed is:

1. A connection system for electronic components (1) comprising:
   a plurality of insulating layers (2) and conductive layers (3); and
   at least one embedded electronic component (4) embedded within at least one of the plurality of insulating layers (2) and conductive layers (3),
   wherein the at least one embedded electronic component (4) is at least one first transistor having a bulk terminal thereof in thermal contact with a thermal duct (6) comprised of a plurality of vias (7) reaching through at least one of an insulating layer (2) and a conductive layer (3) of the connection system for electronic components (1) and emerging on a first outer surface (8) of the connection system for electronic components (1) under a first surface-mounted component (10).

2. The connection system for electronic components (1) of claim 1, wherein the thermal contact between the bulk terminal and the plurality of vias (7) forming the thermal duct mediated by a plurality of vias (5) electrically connecting the bulk terminal to a conductive layer (3) of the connection system for electronic components (1).

3. The connection system for electronic components (1) of claim 1, further comprising at least one second transistor (4) arranged opposite the first transistor relative to a central insulating layer of the connection system for electronic components (1) and having a bulk terminal thereof connected by a plurality of vias (5) to at least one second surface-mounted electronic component (10') arranged on a second outer surface (8') of the connection system for electronic components (1) opposite the first outer surface (8).

4. The connection system for electronic components (1) of claim 1, wherein the second surface-mounted device is an integrated circuit adapted to drive the at least one first and second transistors.

5. The connection system for electronic components (1) of claim 3, wherein the connection system for electronic components (1) comprises a first group of two first transistors (4) connected in parallel and a second group of two second transistors (4) connected in parallel, the first and the second group being connected in series.

6. The connection system for electronic components (1) of claim 1, wherein the vias (7) are in thermal contact with a heat spreading plate arranged on or within the connection system for electronic components (1).

7. The connection system for electronic components (1) of claim 1, wherein the vias (7) are in thermal contact with a conductive adhesive (11) arranged between the outer surface (8) of the connection system for electronic components (1) and the at least one surface-mounted electronic component (10).

8. The connection system for electronic components (1) of claim 1, wherein the at least one first surface-mounted component (10) is an anti-ferroelectric capacitor.

9. The connection system for electronic components (1) of claim 1, wherein the at least one first and second transistor (4) is a transistor chosen from the group comprised of a field effect transistor, in particular a gallium-nitride power transistor, and an insulated gate bipolar transistor.

10. The connection system for electronic components (1) of claim 1, wherein the at least one first surface-mounted component (10) and/or the at least one second surface-mounted component (10') cooperates with a cooling-fan.

11. The connection system for electronic components (1) of claim 3, wherein the at least one first and second transistors (4) are part of a partially embedded half-bridge circuit.

12. The connection system for electronic components (1) of claim 1, which further comprises at least one further embedded electronic component chosen from the group comprised of an electronic chip, in particular semiconductor chip, a capacitor, a resistor, an inductance, a data storage such as a DRAM, a filter, a microprocessor, a performance management component, an optoelectronic component, a voltage converter, an electromechanical transducer and/or -sensor and/or -actor, a transmitter and/or receiver of electromagnetic waves, a cryptographic component, a switch, a microelectromechanical system, a battery a camera and an antenna.

* * * * *